(12) United States Patent
Mo et al.

(10) Patent No.: US 12,222,374 B1
(45) Date of Patent: Feb. 11, 2025

(54) METHOD AND SYSTEM FOR OPTICAL CALCULATION IN RELAY PROTECTION BASED ON THE FARADAY MAGNETO-OPTICAL ROTATION EFFECT

(71) Applicant: HARBIN INSTITUTE OF TECHNOLOGY, Harbin (CN)

(72) Inventors: Caiyun Mo, Harbin (CN); Guoqing Zhang, Harbin (CN); Wenbin Yu, Harbin (CN); Yuxin Zhang, Harbin (CN); Ying Xu, Harbin (CN); Zhizhong Guo, Harbin (CN)

(73) Assignee: HARBIN INSTITUTE OF TECHNOLOGY (CN)

( * ) Notice: Subject to any disclaimer, the term of this patent is extended or adjusted under 35 U.S.C. 154(b) by 0 days.

(21) Appl. No.: 18/517,012

(22) Filed: Nov. 22, 2023

Related U.S. Application Data

(63) Continuation of application No. PCT/CN2023/120469, filed on Sep. 21, 2023.

(51) Int. Cl.
  *G01R 15/24* (2006.01)
  *H02H 1/00* (2006.01)

(52) U.S. Cl.
  CPC ......... *G01R 15/246* (2013.01); *H02H 1/0092* (2013.01)

(58) Field of Classification Search
  CPC .. G01R 15/246; G01R 15/24; G01R 33/0322; G01R 15/245; G01R 19/0092;
  (Continued)

(56) References Cited

U.S. PATENT DOCUMENTS 5,502,373 A * 3/1996 Ryczek ............... G01R 15/246
  324/96
5,696,858 A * 12/1997 Blake ................ G01R 33/0322
  385/12

(Continued)

FOREIGN PATENT DOCUMENTS

CN    201438212 U    4/2010
CN    104158161 A    11/2014
(Continued)

OTHER PUBLICATIONS

Jin Shi-Xin, et al., R esearch on Dynamic Model Test of Optical Differential Protection Based on RTDS, Northeast Electric Power Technology, 2016, pp. 1-3,26, vol. 37 No.6.
(Continued)

*Primary Examiner* — Vinh P Nguyen

(57) ABSTRACT

Optical calculation method and system for relay protection based on Faraday magneto-optical rotation effect are provided. A cascaded optical computing approach is employed, where three optical current transformers are connected in series on a single optical path. Final output optical signal represented as a cascaded multiplication of outputs of three optical current transformers, carries a Faraday rotation angle containing differential current information. Differential current required for protection is computed by modulation ratio which is calculated by use of a carrier and modulation wave signals of the output optical signal detecting by filtering circuit from the third optical current transformer.

14 Claims, 3 Drawing Sheets

(58) Field of Classification Search
CPC .... G01R 33/032; G01R 1/071; G01R 15/242; G01R 15/22; G01R 15/241; G01R 29/00; G01R 23/17; G01R 31/00; G01R 15/247; G01R 35/005; G01R 31/52; G01R 15/20; G01R 31/1218; G01R 19/00; G02B 27/0012; G02B 27/283; G02B 6/001; G02B 6/3672; G02B 26/02; G02B 6/0239; G02F 1/095; G02F 1/0136; G02F 1/0139; G02F 1/0311; G02F 1/09; G02F 1/093; G02F 1/292; H04B 10/532; H04B 10/677; H02H 3/302; H02H 7/263; H02H 1/00; H02H 7/22; H01L 31/04
See application file for complete search history.

(56) References Cited

U.S. PATENT DOCUMENTS

| | | | | |
|---|---|---|---|---|
| 7,038,786 B2* | 5/2006 | Blake | ............... | G01D 5/35303 356/483 |
| 8,836,950 B2* | 9/2014 | Sasaki | ............... | G01R 19/0092 356/483 |
| 10,877,076 B2* | 12/2020 | Bohnert | ............... | G01R 15/247 |

FOREIGN PATENT DOCUMENTS

| | | |
|---|---|---|
| JP | 2001327066 A | 11/2001 |
| JP | 2005140519 A | 6/2005 |
| JP | 2009244176 A | 10/2009 |

OTHER PUBLICATIONS

Jun Chen, et al., Research and Application of Generator Protection Based on Fiber Optical Current Transformer, IEEE on IEEE Power & Energy Society Section, 2020, pp. 172405-172411, vol. 8.

Zainal Arifin, et al., Impact of optical current transformer on protection scheme of hybrid transmission line, Indonesian Journal of Electrical Engineering and Computer Science, 2021, pp. 1-11, vol. 24 No. 1.

* cited by examiner

METHOD AND SYSTEM FOR OPTICAL CALCULATION IN RELAY PROTECTION BASED ON THE FARADAY MAGNETO-OPTICAL ROTATION EFFECT

CROSS REFERENCE TO THE RELATED APPLICATIONS

This application is a continuation application of International Application No. PCT/CN2023/120469, filed on Sep. 21, 2023, which is based upon and claims priority to Chinese Patent Application No. 202311015254.6, filed on Aug. 11, 2023, the entire contents of which are incorporated herein by reference.

TECHNICAL FIELD

The present invention belongs to the field of relay protection technology in power systems.

BACKGROUND

Power system dominated by power electronics impose higher requirements on fastness and protection information of relay protection. With gradual formation of the UHV AC/DC and continuous growth of renewable energy integration capacity, low inertia, weak disturbance resistance, and multi-time-scale response characteristics of power electronic devices contribute to a decrease in the time constant (in the millisecond range) of the new power system, primarily based on renewable energy. The system is more easily to cause disturbance propagation when impacted. Specifically, when a fault occurs but disconnection mechanism fails to act rapidly, the fault propagation exhibits rapidity and high penetrability. In order to ensure safe and stable operation of the new power system, corresponding relay protection technologies should possess higher speed and more reliable responsiveness. A review of history of relay protection indicates that breakthroughs in principles often coincide with an increase in an amount of protection-related information. Full waveform information, which contains comprehensive fault information, is inherently suitable as protection information. The full utilization of full waveform information to construct protection criteria is an inevitable trend in the development of relay protection systems.

Compared to traditional differential protection, based on power frequency quantity, optical differential protection aligns with requirements of relay protection in new power system in terms of speed and protection-related information. Currently, optical differential protection is primarily applied in the field of line protection. Optical differential protection utilizes optical current transformers as measurement devices and employs instantaneous values as characteristic quantity for protection. It no longer extracts power frequency components, thereby retaining full waveform information that comprehensively reflects faults. As a result, it does not require digital filtering window processing and can quickly respond to faults. Optical differential protection devices employ a cascaded optical computation approach to directly calculate differential currents on an analog optical path. This simplifies the design and implementation of protection devices and helps reduce costs.

However, when introducing optical differential protection into the field of transformer protection, it is necessary to address the issue of unequal amplitudes and phase in line currents on both sides of the protected object which caused by transformation ratio and connection group. Under normal operating conditions and external fault scenarios, according to the assumption of the line model, the currents on both sides of the protected object are generally equal, and the differential current approaches zero, ensuring reliable operation of optical differential protection. However, in a transformer model, transformation ratio leads to a multiple relationship between the line currents on both sides. Additionally, in power systems, transformers are often connected in a star-delta configuration, where the high-voltage side is in a star connection while the low-voltage side is in a delta connection. The different types of connections on the high-voltage and low-voltage sides result in a phase difference on both sides of the line currents. Therefore, directly introducing the high-voltage side current and low-voltage side current into optical differential protection would result in excessive differential current and a higher risk of false tripping of the protection system.

SUMMARY

The present invention aims to address the issue of unequal amplitudes and phase in line currents on both sides of the protected object caused by transformation ratio and connection group when introducing optical differential protection into the field of transformer protection. Accordingly, an optical computation method and system for relay protection based on the Faraday magneto-optical rotation effect are provided.

The optical computation system for relay protection based on the Faraday magneto-optical rotation effect comprises of the following components: light source 1, the first optical current transformer 2, the second optical current transformer 3, the third optical current transformer 4, and processing unit 5;

The light signal emitted by light source 1 passes sequentially through the first optical current transformer 2, the second optical current transformer 3, and the third optical current transformer 4, causing the light signal to carry the Faraday rotation angle $\varphi$ containing the differential current information. The outgoing light from the third optical current transformer 4 is incident to the processing unit 5. The transmission of the light signal between the light source 1 and the first optical current transformer 2, the first optical current transformer 2 and the second optical current transformer 3, the second optical current transformer 3 and the third optical current transformer 4, as well as the third optical current transformer 4 and the processing unit 5, is all carried out through multimode fibers.

The Faraday magneto-optical elements of the first optical current transformer 2 and the third optical current transformer 4 are located on the high-voltage side and the low-voltage side of the protected phase of the transformer, respectively. The Faraday magneto-optical element of the second optical current transformer 3 is located on the high-voltage side of the adjacent phase to the protected phase. Under normal operating conditions, the phase difference between the protected phase and its adjacent phase on the high-voltage side of the transformer is the same as the phase of the protected phase on the low-voltage side. The Faraday magneto-optical elements of the first optical current transformer 2, the second optical current transformer 3, and the third optical current transformer 4 can sense the magnetic field generated by the current on their respective sides. Moreover, the angles between the optical path's direction of the first optical current transformer 2 and the current direction on its respective side, the optical path direction of the second optical current transformer 3 and its current direction, and the optical path direction of the third optical current transformer 4 and its current direction satisfies the following condition:

$$\sin\theta_{YA}:\sin\theta_{YB}:\sin\theta_{dA} = 1:1:\frac{\sqrt{3}}{n_T},$$

Among them, $\theta_{YA}$ is the angle between the optical path of the first optical current transformer 2 and the current direction on its respective side, $\theta_{YB}$ is the angle between the optical path of the second optical current transformer 3 and the current direction on its respective side, $\theta_{dA}$ is the angle between the optical path of the third optical current transformer 4 and the current direction on its respective side, and $n_T$ is the transformation ratio.

The processing unit 5 includes the following modules:

Filtering Unit (6): Used to detect the carrier signal $J_{DC}$ and the modulation wave signal $J_{AC}$ of the output optical signal from the third optical current transformer 4 by employing a filtering circuit.

Modulation Ratio Calculation Unit (8): Used to calculate the modulation ratio m based on the following equation:

$$m = \frac{J_{AC}}{J_{DC}},$$

Differential Current Calculation Unit (7): Used to calculate the differential current $i_d$ based on the following equation:

$$i_d = \frac{m}{2VL},$$

Where, V represents the Verdet constant of the magneto-optical element in the first, second and third optical current transformers, and L represents the coefficient of the multiple relationship between the magnetic field integration on the Faraday magneto-optical element in the first, second, and third optical current transformers to the measured current by the first, second and third optical current transformers.

Furthermore, the internal composition structure of the first optical current transformer 2, the second optical current transformer 3, and the third optical current transformer 4 is identical. They all include a few collimators, a polarizer, a Faraday magneto-optical element, and an analyzer.

The incident light is collimated by the collimator and then enters the polarizer, where it becomes polarized light. This polarized light passes through the Faraday magneto-optical element and undergoes rotation under the modulation of the magnetic field in which the Faraday magneto-optical element is located. The rotated polarized light is emitted through the analyzer and then the collimator.

The output ends of the analyzer include output end π/4 and output end −π/4. The angles between the optical axis of the polarizer and the optical axis of output end π/4 and output end −π/4 of the analyzer are π/4 and −π/4 respectively.

The output optical signals of the first optical current transformer 2 and the third optical current transformer 4 are both emitted from the output end −π/4 of their respective analyzers. The output optical signal of the second optical current transformer 3 is emitted from the output end π/4 of its analyzer.

Furthermore, the Faraday rotation angle can be expressed as $\varphi=\varphi_{YA}-\varphi_{YB}+\varphi_{dA}$, In this context, $\varphi_{YA}$ represents the angle of rotation of the polarization light caused by the magnetic field sensed by the first optical current transformer (2). $\varphi_{YB}$ represents the angle of rotation of the emitted light from the first optical current transformer (2) caused by the magnetic field sensed by the second optical current transformer (3). $\varphi_{dA}$ represents the angle of rotation of the emitted light from the second optical current transformer (3) caused by the magnetic field sensed by the third optical current transformer (4).

Furthermore, the intensity $P_{out}$ of the light signal output from the third optical current transformer 4 is given by:

$$P_{out} \approx \frac{1}{8}P_o + \frac{1}{4}P_o(\varphi_{YA}-\varphi_{YB}+\varphi_{dA}) = \frac{1}{8}P_o + \frac{1}{4}P_o\varphi,$$

Where $P_o$ represents the intensity of the emitted light from light source 1.

Furthermore, the light source 1 is a Super luminescent Diode (SLD) with a wavelength of 850 nm.

A Faraday magneto-optical rotation-based optical calculation method for relay protection. This method is implemented based on an optical calculation system designed for transformer optical differential protection. The system includes:

Light source 1, the first optical current transformer 2, the second optical current transformer 3, and the third optical current transformer 4.

The light signal emitted from light source 1 passes through the first optical current transformer 2, the second optical current transformer 3, and the third optical current transformer 4 in sequence, enabling the light signal to carry the Faraday rotation angle 4 that contains differential current information. The transmission of the light signal between light source 1 and the first optical current transformer 2, between the first optical current transformer 2 and the second optical current transformer 3, and between the second optical current transformer 3 and the third optical current transformer 4 is achieved through multimode fibers.

The Faraday magneto-optical elements of the first optical current transformer 2 and the third optical current transformer 4 are located on the high-voltage side and the low-voltage side of the protected phase of the transformer, respectively. The Faraday magneto-optical element of the second optical current transformer 3 is located on the high-voltage side of the adjacent phase to the protected phase. Under normal operating conditions, the phase difference between the protected phase and its adjacent phase on the high-voltage side of the transformer is the same as the phase of the protected phase on the low-voltage side. The Faraday magneto-optical elements of the first optical current transformer 2, the second optical current transformer 3, and the third optical current transformer 4 can sense the magnetic field generated by the current on their respective sides. Moreover, the angles between the optical paths direction of the first optical current transformer 2 and the current direction on its respective side, the optical path direction of the second optical current transformer 3 and its current direction, and the optical path direction of the third optical current transformer 4 and its current direction satisfies the following condition:

$$\sin\theta_{YA}:\sin\theta_{YB}:\sin\theta_{dA} = 1:1:\frac{\sqrt{3}}{n_T},$$

Wherein, $\theta_{YA}$ represents the angle between the optical path of the first optical current transformer 2 and the current direction on its respective side, $\theta_{YB}$ represents the angle between the optical path of the second optical current transformer 3 and the current direction on its respective side, $\theta_{dA}$ represents the angle between the optical path of the third optical current transformer 4 and the current direction on its respective side, and $n_T$ is the transformation ratio.

The optical computational method for the optical differential protection of the transformer is as follows:

The carrier signal $J_{DC}$ and modulation wave signal $J_{AC}$ of the output light signal from the third optical current transformer 4 are detected using a filtering circuit.

The modulation ratio m is calculated according to the following equation:

$$m = \frac{J_{AC}}{J_{DC}},$$

The differential current $i_d$ is calculated according to the following equation:

$$i_d = \frac{m}{2VL},$$

In this context, V denotes the Verdet constant of the magneto-optical element in the first, second and third optical current transformers, and L represents the coefficient of the multiple relationship between the magnetic field integration on the Faraday magneto-optical element in the first, second, and third optical current transformers to its measured current.

Furthermore, the internal composition of the first optical current transformer 2, the second optical current transformer 3, and the third optical current transformer 4 is identical, including a few collimators, a polarizer, a Faraday magneto-optical element, and an analyzer.

The incident light is collimated by the collimator and then enters the polarizer, becoming polarized light. This polarized light passes through the Faraday magneto-optical element and undergoes rotation under the modulation of the magnetic field where the Faraday magneto-optical element is located. The rotated polarized light exits through the analyzer and then the collimator.

The output ends of the analyzer include output end $\pi/4$ and output end $-\pi/4$. The angles between the optical axis of the polarizer and the optical axis of output end $\pi/4$ and output end $-\pi/4$ of the analyzer are $\pi/4$ and $-\pi/4$ respectively.

The output optical signals of the first optical current transformer 2 and the third optical current transformer 4 are both emitted from the output end $-\pi/4$ of their respective analyzers. The output optical signal of the second optical current transformer 3 is emitted from the output end $\pi/4$ of its analyzer.

Furthermore, the Faraday rotation angle is given by $\varphi = \varphi_{YA} - \varphi_{YB} + \varphi_{dA}$ Where $\varphi_{YA}$ is the angle of rotation of the polarized light induced by the magnetic field sensed by the first optical current transformer 2, $\varphi_{YB}$ is the angle of rotation of the output light from the first optical current transformer 2 induced by the magnetic field sensed by the second optical current transformer 3, and $\varphi_{dA}$ is the angle of rotation of the output light from the second optical current transformer 3 induced by the magnetic field sensed by the third optical current transformer 4.

Furthermore, the optical intensity $P_{out}$ of the light signal output from the third optical current transformer 4 is determined by $$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi,$$

Where $P_o$ is the optical intensity of the light emitted from light source 1.

Furthermore, the light source 1 used in this study is a Super luminescent Diode (SLD) light source with a wavelength of 850 nm.

The beneficial effects of this invention are as follows:

(1) The proposed optical calculation method and system for relay protection based on the Faraday magneto-optical rotation effect address the issue of mismatched phase and amplitude between currents on both sides of the protected object, which arises when applying optical differential protection directly to the transformer protection domain. In the case of transformer protection, directly introducing high-side and low-side currents into the optical differential protection can lead to excessive differential current due to the mismatched phase and amplitude of the currents on both sides of the protected object. To address this issue, this invention presents a calculation method for optical differential protection of transformers. In this method, the differential current is expressed as the addition and subtraction operation of the instantaneous values of the three different proportions of the current to be measured to eliminate the mismatch impact of phase and amplitude. To implement this calculation method, a cascaded optical calculation scheme is employed, wherein three optical current transformers are connected in series on a single optical path system and the cascaded multiplication of the output signals of the transformers is used to realize the optical addition and subtraction operations of Faraday rotation angles. This, in turn, enables the calculation of differential current in optical differential protection for transformers.

(2) The optical current transformers utilized in this invention are based on the principle of the Faraday magneto-optical rotation effect, providing excellent dynamic measurement capabilities. They can accurately measure the system's power frequency components, non-periodic components, and various harmonic components. Moreover, they do not suffer from magnetic saturation issues, making them ideal products for real-time measurement of full waveform signals. The optical measurement not only accurately reflects the transient currents on both sides of the protected object but also faithfully captures the transformer's magnetizing inrush current. This provides a reliable measurement method for the fast and effective detection and identification of transformer magnetizing inrush current, preventing false tripping of protection systems.

DETAILED DESCRIPTION OF THE EMBODIMENTS

The following description provides a clear and comprehensive explanation of the technological aspects of the present invention, utilizing the accompanying figures from the exemplary embodiments. It should be noted that the disclosed embodiments are merely a part of the embodiments of the present invention, rather than the entirety of the embodiments. Based on the disclosed embodiments of the present invention, all other embodiments that ordinary skilled artisans in the field can derive without exercising inventive efforts are also within the scope of protection of this invention. It is further noted that, unless conflicting, the features of the embodiments in the present invention can be combined with each other.

Optical differential protection constructs the criterion by summing the instantaneous values of the currents on both sides of the circuit, rather than the sum of the power-frequency quantities. The specific criterion is expressed as follows:

$$g(i_M + i_N) \geq I_{set0} \tag{1}$$

In the equation, g( ) represents the function of optical differential protection, $i_M$ and $i_N$ represent the instantaneous values of phase currents on both sides of the MN line, respectively, and $I_{set0}$ is the setting value.

Applying optical differential protection in Yd11 connected transformer protection requires addressing the issue of inconsistent of magnitudes and phases of line currents on both sides of the transformer, in order to achieve the differential current zero during normal operation and external faults. The phase inconsistency can be resolved by changing the connection type of optical differential protection, i.e., using the difference of two-phase currents instead of its own current on the high-side. The magnitude inconsistency can be resolved by adjusting the current ratio of the relay input. Since the high-side current is represented by the difference of two-phase currents, the magnitude is increased by a factor of $\sqrt{3}$, while considering the transformation ratio, the ratio between the high-side and low-side currents should be $$1 : \frac{\sqrt{3}}{n_T}.$$

Based on the above, the optical differential protection criterion for the transformer, taking phase A as an example, can be expressed as follows:

$$f_A\left((i_{YA} - i_{YB}) + \frac{\sqrt{3}}{n_T} i_{dA}\right) \geq I_{set} \tag{2}$$

In the equation, $f_A( )$ represents the optical differential protection function for phase A. $i_{YA}$ and $i_{YG}$ are the instantaneous values of the high-side line currents for phases A and B, respectively. $i_{dA}$ represents the instantaneous value of the low-side line current for phase A. $I_{set}$ is the set value, and $n_T$ represents the transformation ratio, expressed as follows:

$$n_T = \frac{U_Y}{U_d} \tag{3}$$

Where $U_Y$ is the line voltage on the high-side of the transformer, and $U_d$ is the line voltage on the low-side.

Figure 1:
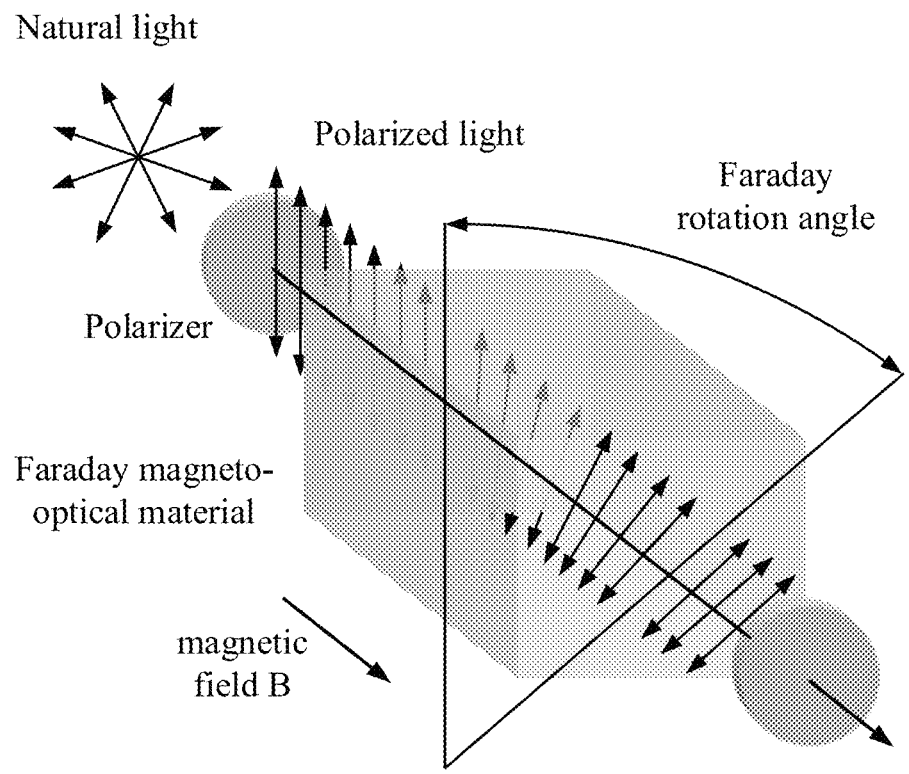
FIG. 1 illustrates the schematic diagram of the principle of the Faraday magneto-optical rotation effect.
Figure 2:
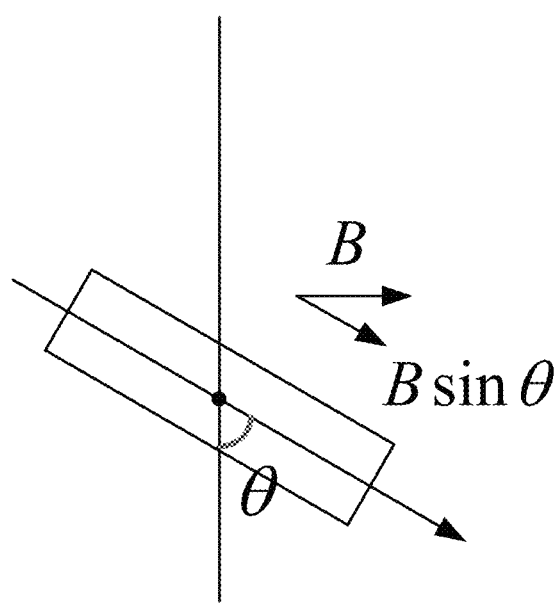
FIG. 2 depicts a schematic diagram illustrating the Faraday magneto-optical element sensing the direction of the magnetic field.

The key to implementing optical differential protection for transformers based on optical computing lies in performing optical addition and subtraction operations using the Faraday rotation angle to achieve addition and subtraction operations of different proportions for the measured currents. The calculation of optical differential protection for transformers only involves simple optical operations such as addition, subtraction, and scaling factors. This can be achieved by adjusting the magnetic field direction on the analog optical path perceived by the Faraday magneto-optical component and the installation position of the optical current transformer. Based on the principle of the Faraday magneto-optical rotation effect, it is known that the measured current i and the Faraday rotation angle φ are directly proportional, as shown in FIG. 1, expressed as:

$$\varphi = V \cdot L \cdot i \cdot \sin\theta \tag{4}$$

In the equation, V is the Verdet constant of the Faraday magneto-optical material, L represents the relationship between the magnetic field integration on the Faraday magneto-optical component and the current i, and θ represents the angle between the optical propagation direction in the optical current transformer and the measured conductor. When the structural parameter of the optical current transformer, L is constant, the addition and subtraction operations of the measured currents with different proportions in equation (2) can be realized on the analog optical path through optical addition and subtraction using the Faraday rotation angle, expressed as:

$$V \cdot L \left( i_{YA} - i_{YB} + \frac{\sqrt{3}}{n_T} i_{dA} \right) = \\ V \cdot L(i_{YA} \sin\theta_{YA} - i_{YB} \sin\theta_{YB} + i_{dA} \sin\theta_{dA}) = \varphi_{YA} - \varphi_{YB} + \varphi_{dA} \tag{5}$$

In the equation, $i_{YA}$, $i_{YG}$ and $i_{dA}$ represent the currents of the measured conductors. $\theta_{YA}$, $\theta_{YB}$, and $\theta_{dA}$ represent the angles between the optical propagation direction in the optical current transformer and the respective measured conductors. $\varphi_{YA}$, $\varphi_{YB}$, and $\varphi_{dA}$ represent the Faraday rotation angles generated by the corresponding measured conductors' currents $i_{YA}$, $i_{YB}$ and $i_{dA}$ under the effect of the magneto-optical rotation.

According to equation (5), current scaling operations can be achieved by varying the installation angles of optical current transformers, while addition and subtraction operations of currents can be achieved through optical addition and subtraction using the Faraday rotation angle. The application of optical computing technology in optical differential protection for transformers represents a significant breakthrough in relay protection and is expected to have unpredictable impacts on the development of protection techniques.

Based on the above foundation, the following specific implementation methods are provided.

Figure 3:
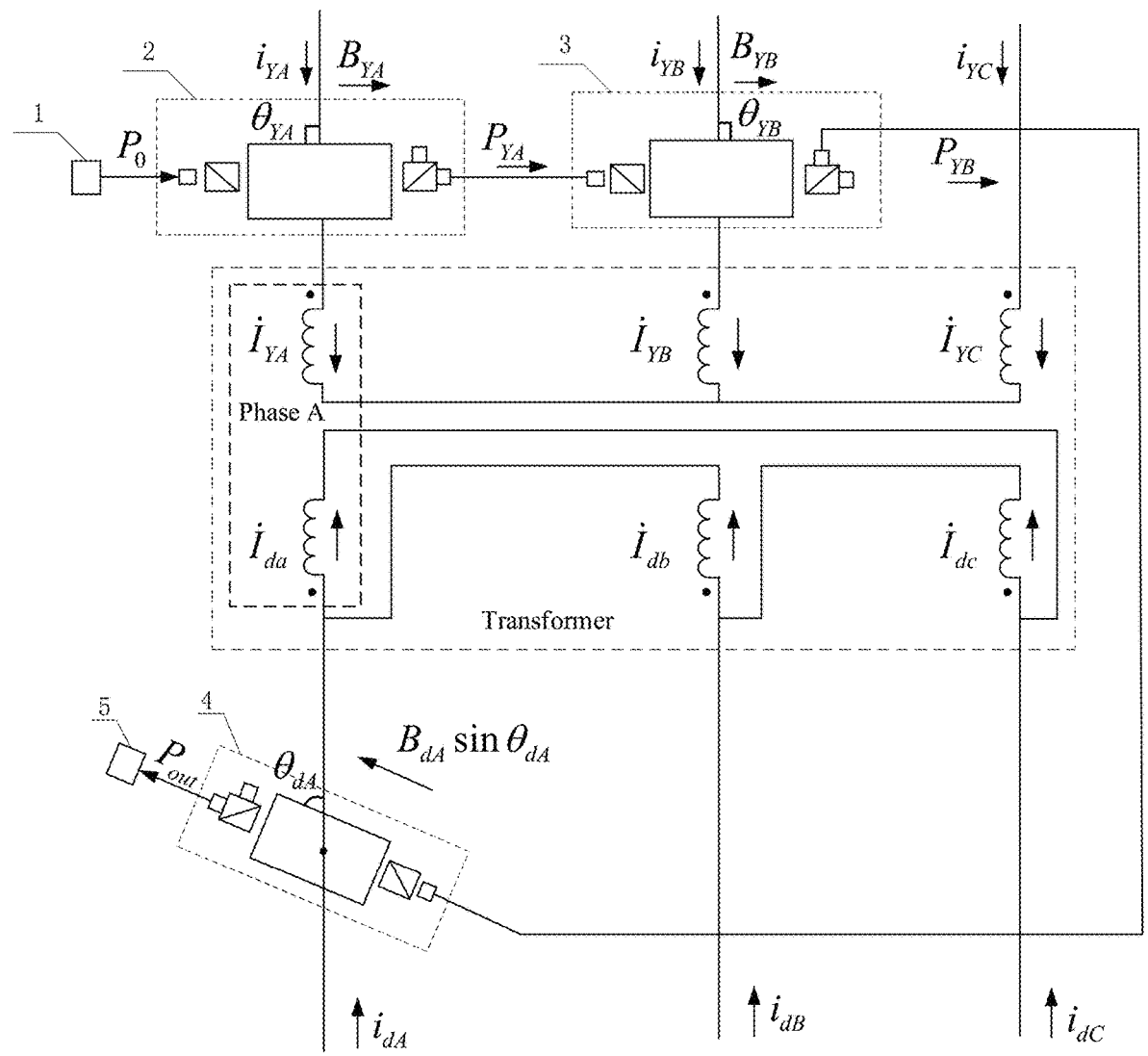
FIG. 3 presents a schematic diagram of an optical calculation system for relay protection based on the Faraday magneto-optical rotation effect.
Figure 4:
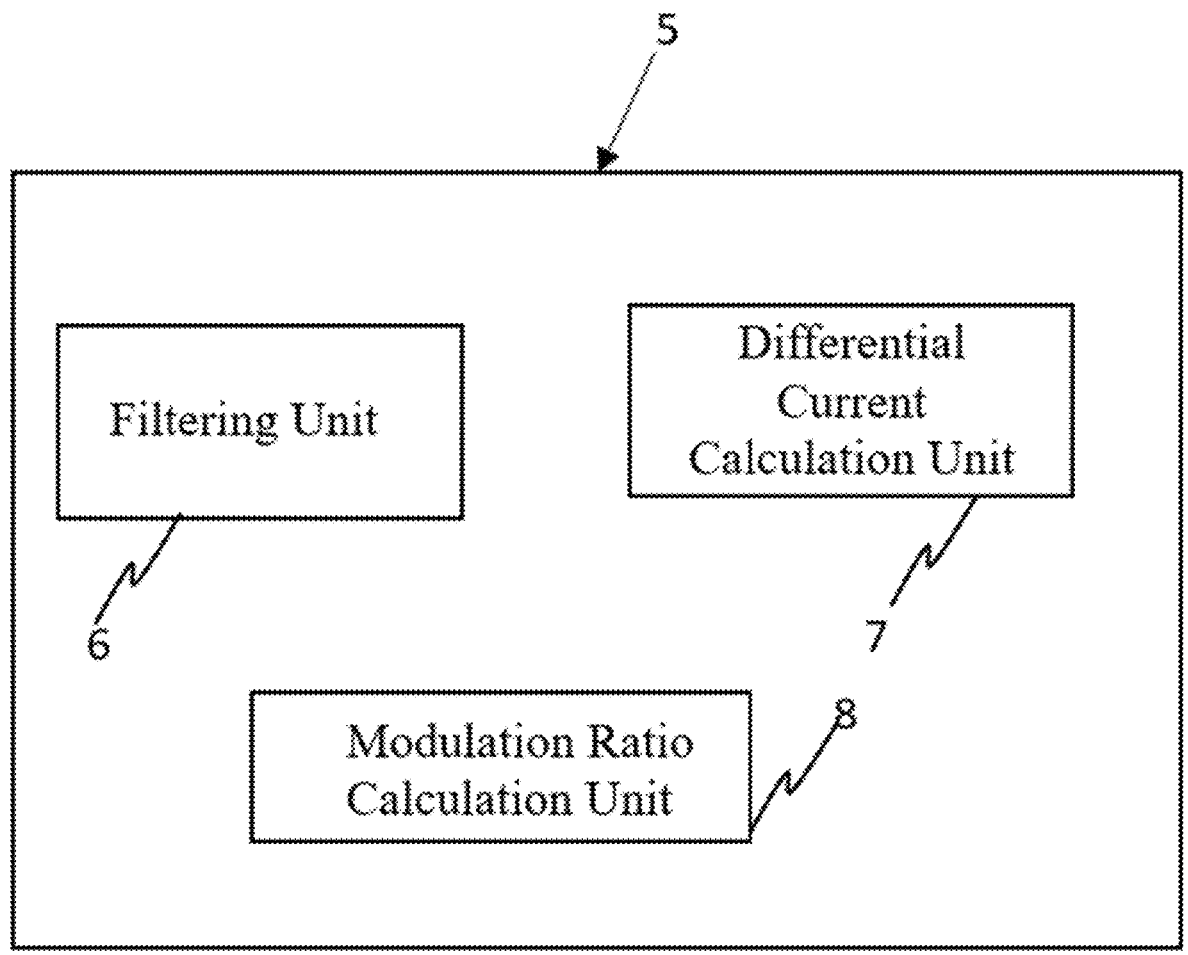
FIG. 4 illustrates a block diagram of a processing unit comprising filtration unit, Differential Current Calculation Unit, and Modulation Ratio Calculation Unit.

Specific implementation method 1: Refer to FIGS. 1 and 3 for a detailed description of this implementation method. The optical computing system for relay protection based on the Faraday magneto-optical rotation effect is illustrated using the A-phase differential circuit of the optical differential protection for transformers as an example. In this example, the protected phase of the transformer is the A-phase, with the high-side current denoted as $i_{YA}$ and the low-side line current denoted as $i_{dA}$. The adjacent phase is the B-phase, with the high-side line current denoted as $i_{YB}$.

The optical computing system for relay protection based on the Faraday magneto-optical rotation effect comprises of: a light source 1, a first optical current transformer 2, a second optical current transformer 3, a third optical current transformer 4, and a processing unit 5. The internal structure of the first optical current transformer 2, the second optical current transformer 3, and the third optical current transformer 4 is the same and includes a few collimators, a polarizer, a Faraday magneto-optical element, and an analyzer. The analyzer is a polarization beam splitter, consisting of an output end π/4 and an output end −π/4. The optical axis of the polarizer forms angles π/4 and −π/4 with optical axis of the output end π/4 and the output end −π/4 of the analyzer, respectively. The optical current transformers are used to sense the required measured current information.

The light source 1 is an 850 nm SLD (Super luminescent Diode) source, providing a stable light source for the system. The emitted light from the light source 1 is sequentially injected into the first optical current transformer 2, the second optical current transformer 3, and the third optical current transformer 4 through a multimode fiber, making the optical signal to carry the Faraday rotation angle φ containing the differential current information. The outgoing light from the third optical current transformer 4 is incident on the processing unit 5. The Faraday magneto-optical elements of the first optical current transformer 2 and the third optical current transformer 4 are located on the high-side and low-side of the protected phase of the transformer, respectively. The Faraday magneto-optical element of the second optical current transformer 3 is located on the high-side of the adjacent phase to the protected phase of the transformer. Under normal operating conditions, the phase difference between the high-voltage side of the protected phase and its adjacent phase is the same as the phase of the low-voltage side of the protected phase.

The Faraday magneto-optical elements of the first optical current transformer 2, the second optical current transformer 3, and the third optical current transformer 4 are capable of sensing the magnetic field generated by the currents on their respective sides. Moreover, the angles between the optical path of the first optical current transformer 2 and the current direction on its respective side, the optical path of the second optical current transformer 3 and its current direction, and the optical path of the third optical current transformer 4 and its current direction satisfy the following condition:

$$\sin\theta_{YA}:\sin\theta_{YB}:\sin\theta_{dA} = 1:1:\frac{\sqrt{3}}{n_T},$$

Where $\theta_{YA}$ represents the angle between the optical path of the first optical current transformer 2 and the current direction on its respective side, $\theta_{YB}$ represents the angle between the optical path of the second optical current transformer 3 and the current direction on its respective side, $\theta_{dA}$ represents the angle between the optical path of the third optical current transformer 4 and the current direction on its respective side, and $n_T$ represents the transformation ratio.

In this embodiment, the optical propagation directions of the first optical current transformer 2 and the second optical current transformer 3 are perpendicular to the conductor, namely, $\theta_{YA}=\theta_{YB}=90°$. While the optical propagation direction of the third optical current transformer 4 forms an acute angle with the conductor direction.

In the first optical current transformer 2, the incident light is emitted by light source 1 with an intensity of $P_o$. The incident light is collimated and then passes through a polarizer, which converts it into polarized light. This polarized light then enters the Faraday magneto-optical element. According to the Faraday magneto-optical effect, when the direction of light propagation is determined, if the magnetic field generated by the current is parallel to the direction of the optical path, the rotation direction of the Faraday rotation angle remains unchanged. Conversely, if the magnetic field's direction is reversed, the rotation direction of the Faraday rotation angle is also reversed. The current $i_{YA}$ generates a magnetic field $B_{YA}$ in the Faraday magneto-optical element, with the reference direction of the magnetic field $B_{YA}$ aligned with the direction of light propagation. Under the modulation of the magnetic field $B_{YA}$, the polarization plane of the polarized light undergoes a positive rotation proportional to the magnitude of current $i_{YA}$, with a Faraday rotation angle of $\varphi_{YA}$. The light exiting the Faraday magneto-optical element is emitted from the output end −π/4 of an analyzer. According to Malus's Law, the intensity of the light emitted from the first optical current transformer 2 is given by $$P_{YA} = \frac{1}{2}P_o[1 + \sin(2\varphi_{YA})].$$

Similarly, in the second optical current transformer 3, the current $i_{YB}$ generates a magnetic field $B_{YB}$ in the Faraday magneto-optical element, and the reference direction of the magnetic field $B_{YB}$ aligns with the direction of light propagation. Under the modulation of the magnetic field $B_{YB}$, the polarization plane of the polarized light undergoes a positive rotation proportional to the magnitude of current $i_{YB}$, with a Faraday rotation angle of $\varphi_{YB}$. The light exiting the Faraday magneto-optical element is emitted from the output end π/4 of an analyzer. According to Malus's Law, the intensity of the light emitted from the second optical current transformer 3 is given by $$P_{YB} = \frac{1}{4}P_o[1 + \sin(2\varphi_{YA})] \cdot [1 - \sin(2\varphi_{YB})].$$

In the third optical current transformer 4, the current $i_{dA}$ generates a magnetic field $B_{dA} \sin \theta_{dA}$ in the Faraday magneto-optical element, and the reference direction of the magnetic field $B_{dA} \sin \theta_{dA}$ aligns with the direction of light propagation. Under the modulation of the magnetic field $B_{dA} \sin \theta_{dA}$, the polarization plane of the polarized light undergoes a positive rotation proportional to the magnitude of current $i_{dA} \sin \theta_{dA}$, with a Faraday rotation angle of $\varphi_{dA}$. The light exiting the Faraday magneto-optical element is emitted from the output end −π/4 of an analyzer. According to Malus's Law, the intensity of the light emitted from the third optical current transformer 4 is given by $$P_{out} = \frac{1}{8}P_o[1+\sin(2\varphi_{YA})]\cdot[1-\sin(2\varphi_{YB})]\cdot[1+\sin(2\varphi_{dA})].$$

The Faraday rotation angle is generally small, and the following approximation holds:

$$\begin{cases} \sin(2\varphi_{YA}) \approx 2\varphi_{YA} \\ \sin(2\varphi_{YB}) \approx 2\varphi_{YB} \\ \sin(2\varphi_{dA}) \approx 2\varphi_{dA} \end{cases},$$

substituting this equation into the light intensity formula of the output signal from the third optical current transformer 4, and neglecting higher-order terms, we have:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi = J_{DC} + J_{AC} \circ$$

The processing unit 5 comprises the following modules:

Filter unit: Utilizing a filtering circuit to detect the carrier signal $J_{DC}$ and modulation wave signal $J_{AC}$ of the output light signal from the third optical current transformer.

Modulation ratio calculation unit: Calculating the modulation ratio m based on the following equation.

$$m = \frac{J_{AC}}{J_{DC}} = 2\varphi,$$

Differential current calculation unit: Calculating the differential current $i_d$ based on the following equation.

$$V \cdot L \cdot i_d = \varphi,$$

$$i_d = \frac{m}{2VL},$$

Where, V is the Verdet constant of the Faraday magneto-optical element in the first, second and third optical current transformers, and L is the coefficient of the multiple relationship between the magnetic field integration in the Faraday magneto-optical element in the first, second, and third optical current transformers to the measured current of the first, second, and third optical current transformers.

The above-mentioned optical path system consists of three optical current transformers connected in series on an analog optical path, resulting in the final output light signal exhibiting a cascaded form of the output signals from the three transformers. This configuration enables the optical path to achieve addition and subtraction operations of the instantaneous values of three different proportional measured currents, thus realizing optical differential protection for the transformer at the optical path level.

In this embodiment, three optical current transformers are connected in series on an analog optical path. Firstly, the optical addition and subtraction operations of Faraday rotation angles in optical differential protection for transformers are achieved by cascaded multiplication of the output signals from the three optical current transformers on the analog optical path. Secondly, the addition and subtraction operations of instantaneous values of different proportional measured currents in the optical differential protection criteria for optical transformers are thus realized. Among them, the proportional calculation of different measured currents is achieved by adjusting the installation angles of the optical current transformers. The addition and subtraction operations of Faraday rotation angles are achieved by adjusting the magnetic field direction generated by the measured current acting on the magneto-optical element and setting a reasonable polarization angle between the polarizer and analyzer for the outgoing light. The entire optical path system starts from the light source, the light beam sequentially enters the first, second, and third optical current transformers through multimode fibers, and the system output appears in the form of cascaded multiplication of the outputs from the three transformers. The output result contains information about the optical addition and subtraction operations of Faraday rotation angles. The entire system achieves optical differential current calculation for transformers at the analog optical path level, thereby improving the reliability of protection.

Specific embodiment 2: The optical calculation method for relay protection based on the Faraday magneto-optical rotation effect described in this embodiment is implemented using an optical calculation system for optical differential protection of transformers. The system includes a light source 1, a first optical current transformer 2, a second optical current transformer 3, and a third optical current transformer 4. The internal structure of the first optical current transformer 2, the second optical current transformer 3, and the third optical current transformer 4 is the same and includes a few collimators, a polarizer, a Faraday magneto-optical element, and an analyzer. The analyzer is a polarization beam splitter, consisting of an output end π/4 and an output end −π/4. The optical axis of the polarizer forms angles π/4 and −π/4 with the optical axis of the output end π/4 and the output end −π/4 of the analyzer, respectively. The optical current transformers are used to sense the required measured current information.

The light source 1 is an 850 nm wavelength SLD (Super luminescent Diode) source, which provides the required stable light for the system. The emitted light from the light source 1 is sequentially coupled into the first optical current transformer 2, the second optical current transformer 3, and the third optical current transformer 4 through multimode fibers. This allows the light signal to carry the Faraday rotation angle φ that contains the differential current information. The outgoing light from the third optical current transformer 4 is then incident on the processing unit 5. The Faraday magneto-optical elements of the first optical current transformer 2 and the third optical current transformer 4 are located on the high-voltage side and low-voltage side of the protected phase of the transformer, respectively. The Faraday magneto-optical element of the second optical current transformer 3 is located on the high-voltage side of the adjacent phase to the protected phase of the transformer. Under normal operating conditions, the phase difference between the high-voltage side of the protected phase and its adjacent phase is the same as the phase of the low-voltage side of the protected phase.

The Faraday magneto-optical elements of the first optical current transformer 2, the second optical current transformer 3, and the third optical current transformer 4 are capable of sensing the magnetic field generated by the currents on their respective sides. Moreover, the angles between the optical path of the first optical current transformer 2 and the current direction on its respective side, the optical path of the second optical current transformer 3 and its current direction, and the optical path of the third optical current transformer 4 and its current direction satisfy the following condition:

$$\sin\theta_{YA} : \sin\theta_{YB} : \sin\theta_{dA} = 1 : 1 : \frac{\sqrt{3}}{n_T},$$

Among them, $\theta_{YA}$ represents the angle between the optical path of the first optical current transformer 2 and the current direction on its respective side, $\theta_{YB}$ represents the angle between the optical path of the second optical current transformer 3 and the current direction on its respective side, $\theta_{dA}$ represents the angle between the optical path of the third optical current transformer 4 and the current direction on its respective side, and $n_T$ represents the transformation ratio.

In this embodiment, the optical propagation direction of the first optical current transformer 2 and the second optical current transformer 3 is perpendicular to the conductor, namely, $\theta_{YA}=\theta_{YB}=90°$. The optical propagation direction of the third optical current transformer 4 forms an acute angle with the direction of the conductor.

In the first optical current transformer 2, the incident light is emitted by light source 1 with an intensity of $P_o$. The incident light is collimated and then passes through a polarizer, which converts it into polarized light. This polarized light then enters the Faraday magneto-optical element. According to the Faraday magneto-optical effect, when the direction of light propagation is determined, if the magnetic field generated by the current is parallel to the direction of the optical path, the rotation direction of the Faraday rotation angle remains unchanged. Conversely, if the magnetic field's direction is reversed, the rotation direction of the Faraday rotation angle is also reversed. The current $i_{YA}$ generates a magnetic field $B_{YA}$ in the Faraday magneto-optical element, with the reference direction of the magnetic field $B_{YA}$ aligned with the direction of light propagation. Under the modulation of the magnetic field $B_{YA}$, the polarization plane of the polarized light undergoes a positive rotation proportional to the magnitude of current $i_{YA}$, with a Faraday rotation angle of $\varphi_{YA}$. The light exiting the Faraday magneto-optical element is emitted from the output end $-\pi/4$ of an analyzer. According to Malus's Law, the intensity of the light emitted from the first optical current transformer 2 is given by $$P_{YA} = \frac{1}{2}P_o[1 + \sin(2\varphi_{YA})].$$

Similarly, in the second optical current transformer 3, the current $i_{YB}$ generates a magnetic field $B_{YB}$ in the Faraday magneto-optical element, and the reference direction of the magnetic field $B_{YB}$ aligns with the direction of light propagation. Under the modulation of the magnetic field $B_{YB}$, the polarization plane of the polarized light undergoes a positive rotation proportional to the magnitude of current $i_{YB}$, with a Faraday rotation angle of $\varphi_{YB}$. The light exiting the Faraday magneto-optical element is emitted from the output end $\pi/4$ of an analyzer. According to Malus's Law, the intensity of the light emitted from the second optical current transformer 3 is given by $$P_{YB} = \frac{1}{4}P_o[1 + \sin(2\varphi_{YA})] \cdot [1 - \sin(2\varphi_{YB})].$$

In the third optical current transformer 4, the current $i_{dA}$ generates a magnetic field $B_{dA} \sin \theta_{dA}$ in the Faraday magneto-optical element, and the reference direction of the magnetic field $B_{dA} \sin \theta_{dA}$ aligns with the direction of light propagation. Under the modulation of the magnetic field $B_{dA} \sin \theta_{dA}$, the polarization plane of the polarized light undergoes a positive rotation proportional to the magnitude of current $i_{dA} \sin \theta_{dA}$, with a Faraday rotation angle of $\varphi_{dA}$. The light exiting the Faraday magneto-optical element is emitted from the output end $-\pi/4$ of an analyzer. According to Malus's Law, the intensity of the light emitted from the third optical current transformer 4 is given by $$P_{out} = \frac{1}{8}P_o[1 + \sin(2\varphi_{YA})] \cdot [1 - \sin(2\varphi_{YB})] \cdot [1 + \sin(2\varphi_{dA})].$$

In general, the Faraday rotation angle is relatively small, and the following equation approximately holds:

$$\begin{cases} \sin(2\varphi_{YA}) \approx 2\varphi_{YA} \\ \sin(2\varphi_{YB}) \approx 2\varphi_{YB} \\ \sin(2\varphi_{dA}) \approx 2\varphi_{dA} \end{cases},$$

by substituting this equation into the intensity formula of the output light signal from the third optical current transformer 4, and neglecting higher-order terms, we have:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi = J_{DC} + J_{AC},$$

The optical calculation method for the optical differential protection of the transformer is as follows:

The carrier signal $J_{DC}$ and modulation wave signal $J_{AC}$ of the output light signal from the third optical current transformer are detected using a filtering circuit.

The modulation ratio m is calculated according to the following equation:

$$m = \frac{J_{AC}}{J_{DC}} = 2\varphi,$$

The differential current $i_d$ is calculated using the following equation:

$$V \cdot L \cdot i_d = \varphi,$$

$$i_d = \frac{m}{2VL},$$

Where V is the Verdet constant of the Faraday magneto-optical element in the first, second and third optical current transformers, and L is the coefficient of the multiple relationship between the magnetic field integral in the Faraday magneto-optical element of the first, second, and third optical current transformers, to the measured current of the optical current transformer first, second, and third optical current transformers.

The proposed optical calculation method and system for relay protection based on the Faraday magneto-optical rotation effect address the issue of mismatched phase and amplitude between currents on both sides of the protected object, which arises when applying optical differential protection directly to the transformer protection domain. In the case of transformer protection, directly introducing high-side and low-side currents into the optical differential protection can lead to excessive differential current due to the mismatched phase and amplitude of the currents on both sides of the protected object. To address this issue, this invention presents a calculation method for optical differential protection of transformers. In this method, the differential current is expressed as the addition and subtraction operation of the instantaneous values of the three different proportions of the current to be measured to eliminate the mismatch impact of phase and amplitude. To implement this calculation method, a cascaded optical calculation scheme is employed, wherein three optical current transformers are connected in series on a single optical path system and the cascaded multiplication of the output signals of the transformers is used to realize the optical addition and subtraction operations of Faraday rotation angles. This, in turn, enables the calculation of differential current in optical differential protection for transformers. The optical current transformers utilized in this invention are based on the principle of the Faraday magneto-optical rotation effect, providing excellent dynamic measurement capabilities. They can accurately measure the system's power frequency components, non-periodic components, and various harmonic components. Moreover, they do not suffer from magnetic saturation issues, making them ideal products for real-time measurement of full waveform signals. The optical measurement not only accurately reflects the transient currents on both sides of the protected object but also faithfully captures the transformer's magnetizing inrush current. This provides a reliable measurement method for the fast and effective detection and identification of transformer magnetizing inrush current, preventing false tripping of protection systems.

Although specific embodiments have been described in this paper to illustrate the present invention, it should be understood that these embodiments are merely examples of the principles and applications of the present invention. Therefore, it should be understood that many modifications can be made to the exemplary embodiments and other arrangements can be designed as long as they do not depart from the spirit and scope of the present invention as defined by the appended claims. It should be further understood that various dependent claims and features described in this paper can be combined in ways different from those described in the original claims. Additionally, features described in individual embodiments can also be used in other disclosed embodiments.

What is claimed is:

1. An optical calculation system for relay protection based on Faraday magneto-optical rotation effect, comprising:
   a light source, a first optical current transformer, a second optical current transformer, a third optical current transformer, and a processing unit;
   a light signal emitted from the light source passes through the first optical current transformer, the second optical current transformer, and the third optical current transformer in sequence, causing the light signal to carry a Faraday rotation angle φ, wherein the Faraday rotation angle φ comprises differential current information;
   an outgoing light from the third optical current transformer enters the processing unit;
   light signals between the light source and the first optical current transformer, the first optical current transformer and the second optical current transformer, the second optical current transformer and the third optical current transformer, as well as the third optical current transformer and the processing unit, are transmitted through multimode fibers;
   Faraday magneto-optical elements of the first optical current transformer and the third optical current transformer are respectively located on a high-voltage side and low-voltage side of a protected phase of transformer;
   a Faraday magneto-optical element of the second optical current transformer is located on a high-voltage side of adjacent phase to the protected phase of the transformer; under normal operating conditions, a phase difference between the protected phase and its adjacent phase on the high-voltage side of transformer share the same phase with the protected phase on the low-voltage side;
   the Faraday magneto-optical elements of the first optical current transformer, the second optical current transformer, and the third optical current transformer are allowed to sense a magnetic field generated by use of a current on their respective sides; angles between optical paths of the first optical current transformer, the second optical current transformer, and the third optical current transformer and a current direction on their respective sides satisfy following relationship:

$$\sin\theta_{YA}:\sin\theta_{YB}:\sin\theta_{dA} = 1:1:\frac{\sqrt{3}}{n_T},$$

wherein,
$\theta_{YA}$ represents the angle between the optical path of the first optical current transformer and the current direction on its respective side;
$\theta_{YB}$ represents the angle between the optical path of the second optical current transformer and the current direction on its respective side; and
$\theta_{dA}$ represents the angle between the optical path of the third optical current transformer and the current direction on its respective side; $n_T$ represents a transformation ratio of the transformer;
the processing unit comprises following modules:
a filtering unit, wherein the filtering unit is configured to detect a carrier signal $J_{DC}$ and a modulation wave signal $J_{AC}$ of an optical signal output from the third optical current transformer using a filtering circuit;
a modulation ratio calculation unit, wherein the modulation ratio calculation unit is configured to calculate a modulation ratio m based on the following equation:

$$m = \frac{J_{AC}}{J_{DC}},$$

and
a differential current calculation unit, wherein the differential current calculation unit is configured to calculate a differential current $i_d$ with the following equation:

$$i_d = \frac{m}{2VL},$$

wherein, V is a Verdet constant of a Faraday magneto-optical element in the first, second and third optical current transformers, L is a coefficient of the multiple relationship between the magnetic field integral on the Faraday magneto-optical element in the first, second and third optical current transformers to its measured current.

2. The optical calculation system for the relay protection based on the Faraday magneto-optical rotation effect according to claim 1, wherein internal structural composition of the first optical current transformer, the second optical current transformer, and the third optical current transformer is identical;
wherein each of the first to third optical current transformers comprises a few collimators, a polarizer, the Faraday magneto-optical element, and an analyzer;
wherein an incident light is collimated by the collimator and enters the polarizer, becoming a polarized light; the polarized light passes through the Faraday magneto-optical element and undergoes a rotation under a modulation of the magnetic field, wherein the Faraday magneto-optical element is located in the magnetic field;
the rotated polarized light passes through the analyzer and is emitted again through the collimator;
output ends of the analyzer comprise output π/4 and output −π/4;
angles between an optical axis of the polarizer and an optical axis of the output π/4 and output −π/4 of the analyzer are π/4 and −π/4 respectively;
optical signals output from the first optical current transformer and the third optical current transformer are both emitted from the output −π/4 of their respective analyzers; and
an optical output signal of the second optical current transformer is emitted from the output π/4 of its analyzer.

3. The optical calculation system for the relay protection based on the Faraday magneto-optical rotation effect according to claim 2, wherein the Faraday rotation angle is allowed to be expressed as $\varphi = \varphi_{YA} - \varphi_{YB} + \varphi_{dA}$;
wherein,
$\varphi_{YA}$ represents an angle of rotation of polarization light caused by magnetic field sensed by the first optical current transformer;
$\varphi_{YB}$ represents an angle of rotation of emitted light from the first optical current transformer caused by magnetic field sensed by the second optical current transformer; and
$\varphi_{dA}$ represents an angle of rotation of emitted light from the second optical current transformer caused by magnetic field sensed by the third optical current transformer.

4. The optical calculation system for the relay protection based on the Faraday magneto-optical rotation effect according to claim 3, wherein an optical intensity $P_{out}$ is an output light signal from the third optical current transformer, and is allowed to be given by:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi,$$

wherein $P_o$ represents an optical intensity of emitted light from the light source.

5. The optical calculation system for the relay protection based on the Faraday magneto-optical rotation effect according to claim 1, wherein the Faraday rotation angle is allowed to be expressed as $\varphi = \varphi_{YA} - \varphi_{YB} + \varphi_{dA}$;
wherein,
$\varphi_{YA}$ represents an angle of rotation of polarization light caused by magnetic field sensed by the first optical current transformer;
$\varphi_{YB}$ represents an angle of rotation of emitted light from the first optical current transformer caused by magnetic field sensed by the second optical current transformer; and
$\varphi_{dA}$ represents an angle of rotation of emitted light from the second optical current transformer caused by magnetic field sensed by the third optical current transformer.

6. The optical calculation system for the relay protection based on the Faraday magneto-optical rotation effect according to claim 5, wherein an optical intensity $P_{out}$ is an output light signal from the third optical current transformer, and is allowed to be given by:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi,$$

wherein $P_o$ represents an optical intensity of emitted light from the light source.

7. The optical calculation system for the relay protection based on the Faraday magneto-optical rotation effect according to claim 1, wherein the light source is a Super Luminescent Diode (SLD) light source with a wavelength of 850 nm.

8. An optical calculation method for relay protection based on Faraday magneto-optical rotation effect, wherein the optical calculation method is implemented by using an optical calculation system; the optical calculation system comprises:
a light source, a first optical current transformer, a second optical current transformer, and a third optical current transformer;
a light signal emitted from the light source passes sequentially through the first optical current transformer, the second optical current transformer, and the third optical current transformer, allowing the light signal to carry a Faraday rotation angle φ, wherein the Faraday rotation angle φ comprises differential current information;
a transmission of the light signal from the light source to the first optical current transformer, from the first optical current transformer to the second optical current transformer, and from the second optical current transformer to the third optical current transformer is achieved through multimode fibers;
Faraday magneto-optical elements of the first optical current transformer and the third optical current transformer are located on a high-voltage side and low-voltage side, respectively, of a protected phase of transformer;
a Faraday magneto-optical element of the second optical current transformer is located on a high-voltage side of adjacent phase to the protected phase of the transformer;
under normal operating conditions, a phase difference between a high-voltage side of the protected phase and its adjacent phase is the same as a phase of the low-voltage side of the protected phase;
the Faraday magneto-optical elements of the first optical current transformer, the second optical current transformer, and the third optical current transformer are allowed to sense a magnetic field generated by a current on their respective sides;
wherein angles between an optical path of the first optical current transformer and a current direction on its respective side, an optical path of the second optical current transformer and its current direction, and an optical path of the third optical current transformer and its current direction satisfies the following condition:

$$\sin\theta_{YA}:\sin\theta_{YB}:\sin\theta_{dA} = 1:1:\frac{\sqrt{3}}{n_T},$$

wherein $\theta_{YA}$ represents the angle between the optical path of the first optical current transformer and the current direction on its respective side, $\theta_{YB}$ represents the angle between the optical path of the second optical current transformer and the current direction on its respective side, $\theta_{dA}$ represents the angle between the optical path of the third optical current transformer and the current direction on its respective side, and $n_T$ represents transformation ratio; and the optical calculation method is as follows:
detecting a carrier signal $J_{DC}$ and a modulation wave signal $J_{AC}$ of an output light signal from the third optical current transformer by using a filtering circuit;
calculating a modulation ratio m based on the following equation:

$$m = \frac{J_{AC}}{J_{DC}},$$

and
calculating a differential current $i_d$ based on the following equation:

$$i_d = \frac{m}{2VL},$$

wherein V is a Verdet constant of a Faraday magneto-optical element in the first, second and third optical current transformers, and, L is a coefficient of the multiple relationship between the magnetic field integral on the Faraday magneto-optical element in the first, second and third optical current transformers to its measured current.

9. The optical calculation method for the relay protection based on the Faraday magneto-optical rotation effect according to claim 6, wherein internal composition structures of the first optical current transformer, the second optical current transformer, and the third optical current transformer are identical;
each of the first to third optical current transformer comprises a few collimators, a polarizer, the Faraday magneto-optical element, and an analyzer;
an incident light is collimated by the collimator and enters the polarizer, becoming a polarized light; the polarized light passes through the Faraday magneto-optical element and undergoes a rotation due to a modulation by the magnetic field, wherein the Faraday magneto-optical element is located in the magnetic field; the rotated polarized light exits the optical calculation system after passing through the analyzer and the collimator;
output ends of the analyzer comprise output end $\pi/4$ and output end $-\pi/4$;
angles between an optical axis of the polarizer and an optical axis of the output end $\pi/4$ and output end $-\pi/4$ of the analyzer are $\pi/4$ and $-\pi/4$ respectively;
output optical signals of the first optical current transformer and the third optical current transformer are both emitted from the output end $-\pi/4$ of their respective analyzers; and
the output optical signal of the second optical current transformer is emitted from the output end $\pi/4$ of its analyzer.

10. The optical calculation method for the relay protection based on the Faraday magneto-optical rotation effect according to claim 9, wherein the Faraday rotation angle is denoted as $\varphi=\varphi_{YA}-\varphi_{YB}+\varphi_{dA}$;
wherein,
$\varphi_{YA}$ represents an angle of rotation of polarization light caused by magnetic field sensed by the first optical current transformer;
$\varphi_{YB}$ represents an angle of rotation of emitted light from the first optical current transformer caused by magnetic field sensed by the second optical current transformer; and
$\varphi_{dA}$ represents an angle of rotation of emitted light from the second optical current transformer caused by magnetic field sensed by the third optical current transformer.

11. The optical calculation method for the relay protection based on the Faraday magneto-optical rotation effect according to claim 10, wherein an intensity $P_{out}$ of an output light signal from the third optical current transformer is given by:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi,$$

wherein $P_o$ represents an intensity of the light signal emitted by the light source.

12. The optical calculation method for the relay protection based on the Faraday magneto-optical rotation effect according to claim 8, wherein the Faraday rotation angle is denoted as $\varphi=\varphi_{YA}-\varphi_{YB}+\varphi_{dA}$;
wherein,
$\varphi_{YA}$ represents an angle of rotation of polarization light caused by magnetic field sensed by the first optical current transformer;
$\varphi_{YB}$ represents an angle of rotation of emitted light from the first optical current transformer caused by magnetic field sensed by the second optical current transformer; and
$\varphi_{dA}$ represents an angle of rotation of emitted light from the second optical current transformer caused by magnetic field sensed by the third optical current transformer.

13. The optical calculation method for the relay protection based on the Faraday magneto-optical rotation effect according to claim 12, wherein an intensity $P_{out}$ of an output light signal from the third optical current transformer is given by:

$$P_{out} \approx \frac{1}{8}P_o + \frac{1}{4}P_o(\varphi_{YA} - \varphi_{YB} + \varphi_{dA}) = \frac{1}{8}P_o + \frac{1}{4}P_o\varphi,$$

wherein $P_o$ represents an intensity of the light signal emitted by the light source.

14. The optical calculation method for the relay protection based on the Faraday magneto-optical rotation effect according to claim 8, wherein the light source is a SLD with a wavelength of 850 nm.

* * * * *